US012763758B1

(12) United States Patent
Huang et al.

(10) Patent No.: US 12,763,758 B1
(45) Date of Patent: Oct. 13, 2026

(54) RING OSCILLATOR CIRCUIT

(71) Applicant: UNITED MICROELECTRONICS CORP., Hsin-Chu City (TW)

(72) Inventors: Cheng-Tung Huang, Kaohsiung City (TW); Ting-Hao Chang, Kaohsiung City (TW); Chien-Yu Ko, Tainan City (TW); Wei-Jen Chen, Tainan City (TW); Chuang-Han Hsieh, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 0 days.

(21) Appl. No.: 19/214,053

(22) Filed: May 21, 2025

(30) Foreign Application Priority Data

Apr. 30, 2025 (CN) ......................... 202510562956.9

(51) Int. Cl.
*H03K 3/03* (2006.01)

(52) U.S. Cl.
CPC .................................. *H03K 3/0315* (2013.01)

(58) Field of Classification Search
CPC .................................................... H03K 3/0315
See application file for complete search history.

(56) References Cited

U.S. PATENT DOCUMENTS

| | | | | |
|---|---|---|---|---|
| 8,850,608 | B2 | 9/2014 | Tehranipoor | |
| 2016/0153840 | A1* | 6/2016 | Huang | G01K 7/01 363/71 |
| 2025/0208199 | A1* | 6/2025 | Diaz Fortuny | G01R 31/2856 |

* cited by examiner

*Primary Examiner* — Jeffrey M Shin
(74) *Attorney, Agent, or Firm* — Winston Hsu

(57) ABSTRACT

The present invention provides a ring oscillator circuit characterized by comprising a ring oscillator that includes a plurality of series-connected logic elements for generating an oscillation signal, and a transmission gate coupled to the signal path of the ring oscillator. When the ring oscillator is in a stopped state, the transmission gate is turned off to block the signal path, thereby reducing the leakage current of the ring oscillator. Compared to conventional technologies, the advantage of the present invention lies in its ability to significantly reduce standby power consumption while offering possibilities for further optimization, such as dynamic control or bypass design, making it suitable for various low-power applications.

11 Claims, 3 Drawing Sheets

RING OSCILLATOR CIRCUIT

BACKGROUND OF THE INVENTION

1. Field of the Invention

The present invention pertains to the field of electronic circuit design, specifically relating to a ring oscillator circuit for generating an oscillation signal. The invention offers advantages such as significantly reducing leakage current while maintaining the stability of oscillation performance, making it suitable for the demands of modern electronic devices.

2. Description of the Prior Art

With the continuous advancement of integrated circuit technology, particularly in low-power applications, effectively reducing standby power consumption of circuits has become a critical design challenge. A ring oscillator is a common oscillation signal generator, with its basic principle utilizing an odd number of logic gates (typically inverters) connected in series to form a closed loop. When a signal passes through these logic gates, continuous oscillation is generated due to delay and logic inversion. This structure is simple and easy to integrate, thus widely used in clock generation, frequency modulation, and test circuits. However, as semiconductor processes advance to the nanometer scale (e.g., 22 nm or 14 nm), the reduction in transistor size leads to a significant increase in subthreshold leakage current, causing conventional ring oscillators to generate unnecessary power consumption even in a stopped state (i.e., when the enable signal is low). This leakage current not only reduces the energy efficiency of the circuit but also imposes an additional burden on battery-powered devices (e.g., mobile phones or IoT devices).

Researchers have attempted various methods to solve the leakage current issue. For instance, increasing the threshold voltage of transistors can reduce leakage but often at the expense of oscillation speed. Furthermore, conventional ring oscillator designs primarily focus on optimizing performance in the active state, with insufficient attention to power consumption control in the stopped state, failing to meet the increasingly stringent requirements of modern low-power applications. Therefore, effectively reducing leakage current without significantly impacting oscillation performance has become an urgent technical challenge. The present invention is proposed in this context, aiming to provide a solution that balances efficiency and performance through structural innovation.

SUMMARY OF THE INVENTION

The present invention provides a ring oscillator circuit characterized by comprising a ring oscillator that includes a plurality of series-connected logic elements for generating an oscillation signal, and a transmission gate coupled to the signal path of the ring oscillator. When the ring oscillator is in a stopped state, the transmission gate is turned off to block the signal path, thereby reducing the leakage current of the ring oscillator.

The primary objective of the present invention is to provide a ring oscillator circuit that solves the issue of excessive leakage current in the stopped state in conventional designs while ensuring the quality of the oscillation signal. To achieve this objective, the present invention introduces a transmission gate coupled to the signal path of the ring oscillator. When the circuit is in a stopped state, the transmission gate is turned off to block the signal path, effectively reducing leakage current. This design is not only simple and easy to implement but also allows flexible adjustments based on application requirements, offering broad practicality.

The feature of the present invention lies in that the ring oscillator circuit provided by the invention comprises a ring oscillator and a transmission gate. The ring oscillator is composed of a plurality of series-connected logic elements, such as a NAND gate and inverters, functioning to generate a stable oscillation signal. The transmission gate serves as a controllable switch, configured at a critical position in the signal path. When the enable signal is low (i.e., stopped state), the transmission gate is turned off, interrupting the signal flow between logic elements, thereby suppressing the generation of subthreshold leakage current. Compared to conventional technologies, the advantage of the present invention lies in its ability to significantly reduce standby power consumption while offering possibilities for further optimization, such as dynamic control or bypass design, making it suitable for various low-power scenarios.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

To facilitate easier understanding of the following text, reference may be made simultaneously to the drawings and their detailed descriptions. Through the specific embodiments described herein and with reference to the corresponding drawings, the specific embodiments of the present invention are explained in detail and used to illustrate the operational principles of the specific embodiments of the present invention. Additionally, for clarity, the features in the drawings may not be drawn to actual scale; thus, the dimensions of some features in certain drawings may be deliberately enlarged or reduced.

DETAILED DESCRIPTION

Figure 1:
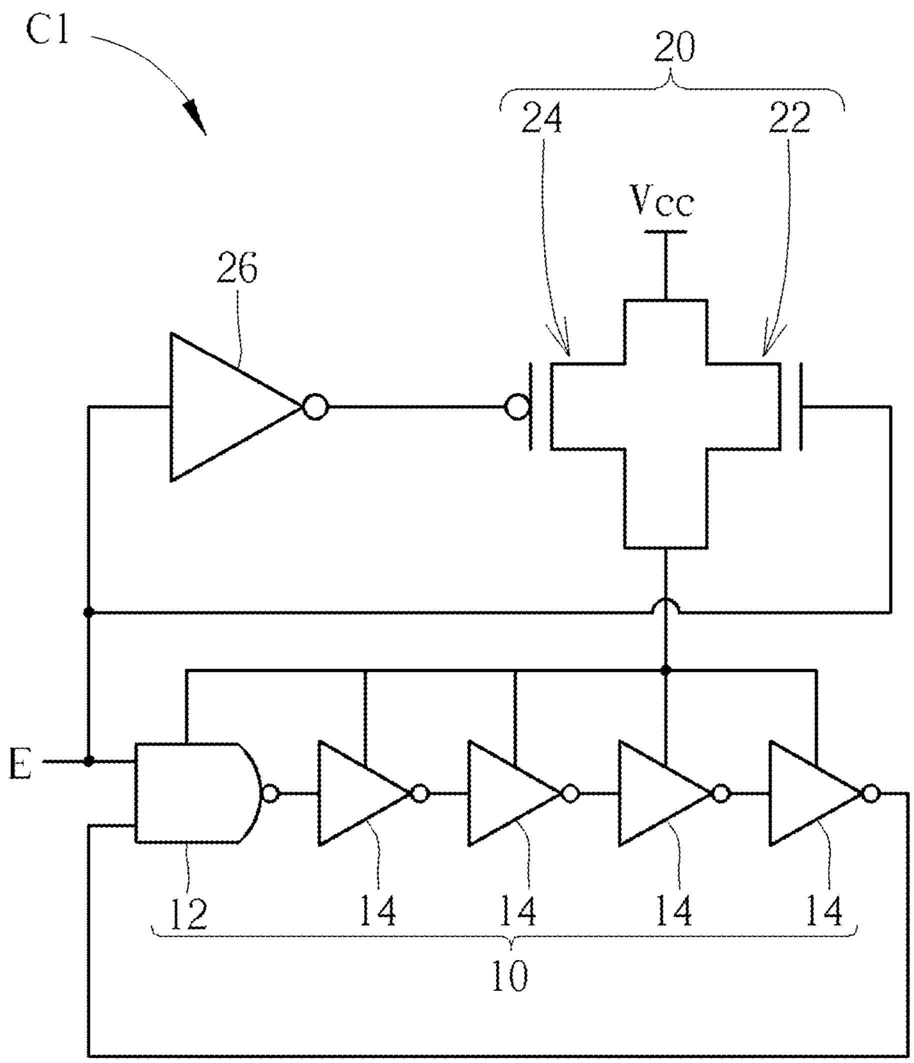
FIG. 1 is a schematic diagram of the basic structure of a ring oscillator circuit, showing the configuration and connection relationships of a ring oscillator and a transmission gate.

Although specific configurations and arrangements are discussed herein, it should be understood that this is done for illustrative purposes only. Persons skilled in the relevant art will recognize that other configurations and arrangements can be used without departing from the spirit and scope of the present disclosure. It will be apparent to those skilled in the relevant art that the present disclosure can also be employed in various other applications.

It should be noted that references in the specification to "one embodiment," "an embodiment," "example embodiment," "some embodiments," etc., indicate that the described embodiment may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it is within the knowledge of those skilled in the relevant art to effect such feature, structure, or characteristic in connection with other embodiments, whether or not explicitly described.

Generally, terminology may be understood at least in part based on the context in which it is used. For example, the term "one or more" as used herein, depending at least in part on the context, may be used to describe any feature, structure, or characteristic in a singular sense or may be used to describe a plurality of features, structures, or characteristics in a plural sense. Similarly, terms such as "a," "an," or "the" may be understood to convey a singular usage or a plural usage, depending at least in part on the context. Additionally, the term "based on" may be understood as not necessarily intended to convey an exclusive set of factors and may, instead, allow for the existence of additional factors not necessarily expressly described, again depending at least in part on the context.

It should be readily understood that the meaning of "on," "above," and "over" in the present disclosure should be interpreted in the broadest manner, such that "on" not only means "directly on" something but also includes the meaning of "on" something with an intermediate feature or layer therebetween, and that "above" or "over" not only means the meaning of "above" or "over" something but can also include the meaning of "above" or "over" something with no intermediate feature or layer therebetween (i.e., directly on something).

Further, for ease of description, spatially relative terms such as "beneath," "below," "lower," "above," "upper," and the like, as indicated in the figures, may be used to describe one element or feature's relationship to another element(s) or feature(s). Besides the orientation depicted in the figures, the spatially relative terms are intended to encompass different orientations of the device in use or operation. The apparatus may be otherwise oriented (rotated 90 degrees or at other orientations), and the spatially relative descriptors used herein may likewise be interpreted accordingly.

The technical principle of the present invention is based on the fundamental operating mechanism of a ring oscillator. Conventionally, a ring oscillator consists of an odd number of logic gates. When an input signal passes through these gates, periodic oscillation signals are generated due to accumulated delay and logic inversion. However, in the stopped state, transistor leakage current continues to flow through the signal path, a phenomenon that becomes more pronounced in advanced processes.

To solve these issues with the above-described ring oscillator, the present invention proposes an improved ring oscillator circuit characterized by integrating a ring oscillator with a transmission gate.

To facilitate understanding of the design of the ring oscillator circuit in this embodiment, the basic principle and structure of the ring oscillator are briefly introduced below. A ring oscillator is a circuit that utilizes the delay characteristics of logic gates to generate an oscillation signal, widely used in integrated circuit design. Its core structure consists of a series of logic gates (typically inverters or other logic elements) connected in series to form a closed loop. As a signal passes through each logic gate, a certain delay is introduced due to the switching behavior of transistors. These delays accumulate, ultimately causing the signal to periodically invert within the loop, forming a stable oscillation output. To satisfy oscillation conditions, a ring oscillator typically requires an odd number of inverters, as an odd number of inverters can provide a 180-degree phase shift, combined with additional phase changes contributed by delay, forming positive feedback. In practical applications, the frequency range of a ring oscillator can span from several megahertz (MHz) to tens of gigahertz (GHz), making it suitable for clock generation, frequency modulation, or random number generation scenarios. For example, in digital processors, a ring oscillator is commonly used to generate synchronized clock signals to ensure coordinated operation of various modules. Another characteristic of a ring oscillator is its flexibility; by adjusting the number of logic gates or transistor parameters, the oscillation frequency can be easily modified, making it particularly useful for testing circuit performance or calibrating process parameters. However, frequency stability and sensitivity to power supply noise are factors to consider during design, especially in high-frequency applications, where parasitic capacitance and inductance may affect oscillation quality. Based on the above characteristics, the ring oscillator 10 of this embodiment adopts a specific configuration of logic elements and integrates a transmission gate structure to effectively reduce leakage current while maintaining oscillation performance.

A NAND gate is a fundamental logic gate that implements an AND-NOT operation, with its output being logic low (0) only when all inputs are logic high (1), and logic high (1) otherwise. In complementary metal-oxide-semiconductor (CMOS) technology, a NAND gate is composed of two parallel P-type metal-oxide-semiconductor (PMOS) transistors and two series-connected N-type metal-oxide-semiconductor (NMOS) transistors. The source of the PMOS transistors is connected to the power supply (VDD), and the drain of the NMOS transistors is ultimately connected to ground (GND). Two input signals control the gates of the corresponding PMOS and NMOS transistors, respectively. When any input is low, at least one PMOS transistor is turned on, pulling the output to VDD; when both inputs are high, both NMOS transistors in series are turned on, pulling the output to GND. This structure ensures low static power consumption in steady-state, as only brief dynamic power consumption occurs during input transitions. The logical versatility of a NAND gate makes it highly valuable in integrated circuit design, as it can implement any logic function, such as inversion, AND, or OR operations, through appropriate combinations. In a ring oscillator, a NAND gate is typically used to provide control functions, such as enabling or disabling oscillation by connecting one input to an enable signal. When the enable signal is high, the NAND gate functions equivalently to an inverter, participating in the oscillation loop; when the enable signal is low, the NAND gate output is fixed at high, stopping oscillation. Compared to a simple inverter, a NAND gate involves more transistors (four), resulting in slightly higher delay times, for example, in a 22 nm process, the propagation delay of a NAND gate may be 20%-30% higher than that of an inverter. Additionally, the design of a NAND gate requires consideration of transistor size matching to ensure a balance between logic threshold and switching speed. In low-power applications, the leakage current of a NAND gate is also a significant consideration, particularly in advanced processes, where subthreshold leakage in series NMOS transistors may accumulate, affecting standby power consumption. Therefore, designers may opt for high-threshold transistors or optimize layouts to reduce leakage. Another advantage of a NAND gate is its relative robustness against noise, as its multi-input structure can filter transient disturbances at the input to some extent.

An inverter is one of the most fundamental logic gates in integrated circuits, with the function of inverting the logic state of an input signal, i.e., converting logic high (1) to logic low (0) and vice versa. In CMOS technology, an inverter is composed of a P-type metal-oxide-semiconductor (PMOS) transistor and an N-type metal-oxide-semiconductor (NMOS) transistor, with their gates connected as the input, drains connected as the output, the PMOS source connected to the power supply (VDD), and the NMOS source connected to ground (GND). When the input is low, the PMOS transistor is turned on, and the NMOS transistor is turned off, pulling the output to VDD; when the input is high, the NMOS transistor is turned on, and the PMOS transistor is turned off, pulling the output to GND. The complementary structure offers the advantage of extremely low static power consumption, as only one transistor is turned on in steady-state, avoiding the formation of a direct current path. The delay time of an inverter depends on the switching speed of the transistors and the load capacitance at the output, typically ranging from a few picoseconds to tens of picoseconds, which is critical for the oscillation frequency of a ring oscillator. In a ring oscillator, inverters are the primary delay elements; by connecting a plurality of inverters in series, the signal repeatedly inverts within the loop, forming periodic oscillation. The design of an inverter requires a trade-off between speed, power consumption, and area. For example, increasing the width-to-length ratio (W/L) of transistors can enhance drive capability and reduce delay but increases dynamic power consumption and chip area; in low-power designs, using high-threshold transistors can reduce leakage current but may lead to reduced speed. In advanced processes (e.g., 14 nm FinFET), the leakage current issue of inverters is particularly pronounced, as transistor size reduction significantly increases subthreshold leakage current. For instance, the leakage current of a standard inverter may reach tens of picoamperes, which accumulates into significant standby power consumption in a ring oscillator composed of multiple inverters. Additionally, inverter performance is affected by power supply voltage and temperature variations; for example, at low voltage operation (e.g., 0.8V), switching speed may decrease by 30%, requiring compensation during design. Another important characteristic of an inverter is its symmetry; an ideal inverter has symmetrical rise and fall times at the logic threshold (typically VDD/2), which helps ensure the stability of the oscillation signal.

A transmission gate is a commonly used controllable switch element for selectively conducting or blocking a signal path, widely applied in both digital and analog circuits. In CMOS technology, a transmission gate is composed of an N-type metal-oxide-semiconductor (NMOS) transistor and a P-type metal-oxide-semiconductor (PMOS) transistor connected in parallel, with their gates receiving complementary control signals, respectively. When the control signal causes both the NMOS and PMOS transistors to conduct simultaneously, the transmission gate allows an input signal to pass from one end to the other; when the control signal turns both transistors off, the signal path is blocked. The parallel structure of a transmission gate enables it to transmit a full voltage range (from 0V to VDD) without signal loss due to transistor threshold voltages. For example, an NMOS transistor excels at transmitting low-voltage signals (close to 0V), while a PMOS transistor excels at transmitting high-voltage signals (close to VDD), and their combination ensures signal integrity. The on-resistance of a transmission gate typically ranges from tens to hundreds of ohms, depending on transistor size and process parameters. In a ring oscillator, a transmission gate can be used to control the connectivity of the signal path, such as stopping oscillation by turning off the transmission gate, thereby reducing standby power consumption. However, the introduction of a transmission gate also presents challenges, such as its on-resistance and parasitic capacitance, which may increase the delay in the signal path, affecting the oscillation frequency. In a 14 nm process, the parasitic capacitance of a typical transmission gate may reach a few femtofarads (fF), which requires careful consideration in high-frequency applications. Additionally, the leakage current of a transmission gate is a critical factor in design, particularly in the standby state, where subthreshold leakage in the NMOS and PMOS transistors may form weak paths through a turned-off transmission gate, affecting low-power goals. Therefore, the transistor type (e.g., high-threshold or standard-threshold) and size of a transmission gate need to be optimized to balance on-state performance and leakage characteristics. Another advantage of a transmission gate is its fast response capability, with switching times typically in the picosecond range, making it suitable for dynamic control applications, such as enable signal synchronization control in the present invention. The design of a transmission gate also needs to consider the impact of power supply voltage; at low-voltage operation, on-resistance may increase significantly, requiring compensation through larger transistor sizes or low-threshold transistors.

Having introduced the fundamental components mentioned in the present invention, the following paragraphs will describe various embodiments of the invention.

Embodiment 1

FIG. 1 illustrates a schematic diagram of a ring oscillator circuit according to a first embodiment of the present invention. The circuit C1 comprises a ring oscillator 10 and a transmission gate 20. The ring oscillator 10 is composed of a NAND gate 12 and a plurality of inverters 14 connected in series. The ring oscillator 10 can be applied to a clock generator, a random number generator (RNG), or other high-performance, low-power applications. Notably, in this embodiment, the ring oscillator 10 includes a NAND gate 12 and an even number of inverters 14. As mentioned earlier, a conventional ring oscillator includes an odd number of inverters, whereas in this embodiment, the NAND gate 12 functions as one of the inverters, meaning the remaining inverters 14 are an even number. Thus, the ring oscillator 10 (including one NAND gate 12 and an even number of inverters 14) has the same efficacy as a conventional ring oscillator (including an odd number of inverters). As shown in the embodiment of FIG. 1, the ring oscillator 10 includes one NAND gate 12 and four inverters 14, making the ring oscillator 10 equivalent to a ring oscillator with five inverters, with a stage count of, for example, 5. It should be understood that the number of the inverters 14 can be adjusted according to requirements, and the present invention is not limited thereto.

The transmission gate 20 is coupled between the NAND gate 12 and the inverters 14, with one end of the transmission gate connected to a voltage source Vcc and the other end connected to the NAND gate 12 and the four inverters 14. When the transmission gate 20 is turned on, the voltage source Vcc passes through the transmission gate to provide a startup voltage to the NAND gate 12 and the four inverters 14. The transmission gate 20 comprises an N-type transistor 22 and a P-type transistor 24 configured in parallel, with its control signal synchronized with an enable signal (denoted as E in the figure) of the ring oscillator. As shown in the circuit diagram of FIG. 1, when the enable signal is low (E=0), it indicates that the ring oscillator stops oscillating. Simultaneously, when the enable signal is low (or referred to as a 0 signal, E=0), the signal received by the N-type transistor 22 is 0, causing the N-type transistor 22 to be turned off (the N-type transistor 22 is turned off when receiving a 0 signal and turned on when receiving a 1 signal). Additionally, the gate terminal of the P-type transistor 24 is connected to an inverter 26. When a 0 signal passes through the inverter 26, it is converted to a 1 signal, which, when received by the P-type transistor 24, also causes the P-type transistor 24 to be turned off (the P-type transistor 24 is turned off when receiving a 1 signal and turned on when receiving a 0 signal). Therefore, for the entire transmission gate 20, when the enable signal is low or 0, the transmission gate 20 is in an off state. In other words, when the ring oscillator 10 stops oscillating, the transmission gate 20 is also turned off simultaneously, preventing the voltage source Vcc from providing a startup voltage to the NAND gate 12 and the inverters 14 through the transmission gate 20. Consequently, the NAND gate 12 and the inverters 14 are turned off, thereby blocking the signal path and significantly reducing subthreshold leakage current.

In a preferred embodiment of the present invention, the transmission gate 20 employs a high-threshold voltage (HVT) transistor configuration. Simulation results show that, compared to using standard-threshold voltage (SVT) transistors, the HVT configuration significantly reduces leakage current. For example, in a 22 nm process, the standby current (IDDQ) is reduced from 1.00× to 0.07× (a significant reduction of 93% in standby current); in a 14 nm process, the standby current is reduced from 1.00× to 0.04× (a significant reduction of 96% in standby current). Although the HVT configuration results in an approximately 5% reduction in oscillation speed (e.g., from 10.66 GHz to 10.06 GHz), considering both the significant reduction in standby current (leakage current) and the minor reduction in oscillation speed, the overall performance of the ring oscillator is still improved, demonstrating a better trade-off between leakage current and speed. Thus, HVT is a preferred choice.

In some embodiments of the present invention, the size design of the transmission gate 20 is also optimized. In a 22 nm process, the width-to-length ratio (W/L) of the transmission gate 20 is 3*2/0.03 micrometers; in a 14 nm process, using a FinFET structure, the width-to-length ratio is 20/0.016 micrometers, with a fin count of 20. This size design ensures an optimal balance between leakage current reduction and oscillation performance. The above data, based on experiments conducted by the applicant, yield significant performance improvements. In other words, while the present invention does not limit the actual size of the transmission gate 20, designing according to the above width-to-length ratios can achieve optimized performance enhancements.

The following will describe different embodiments of the present invention. For simplicity, the descriptions below primarily focus on the differences between the embodiments, without redundant repetition of identical aspects. Additionally, identical components in the various embodiments of the present invention are denoted with the same reference numerals to facilitate cross-referencing between embodiments.

Embodiment 2

Figure 2:
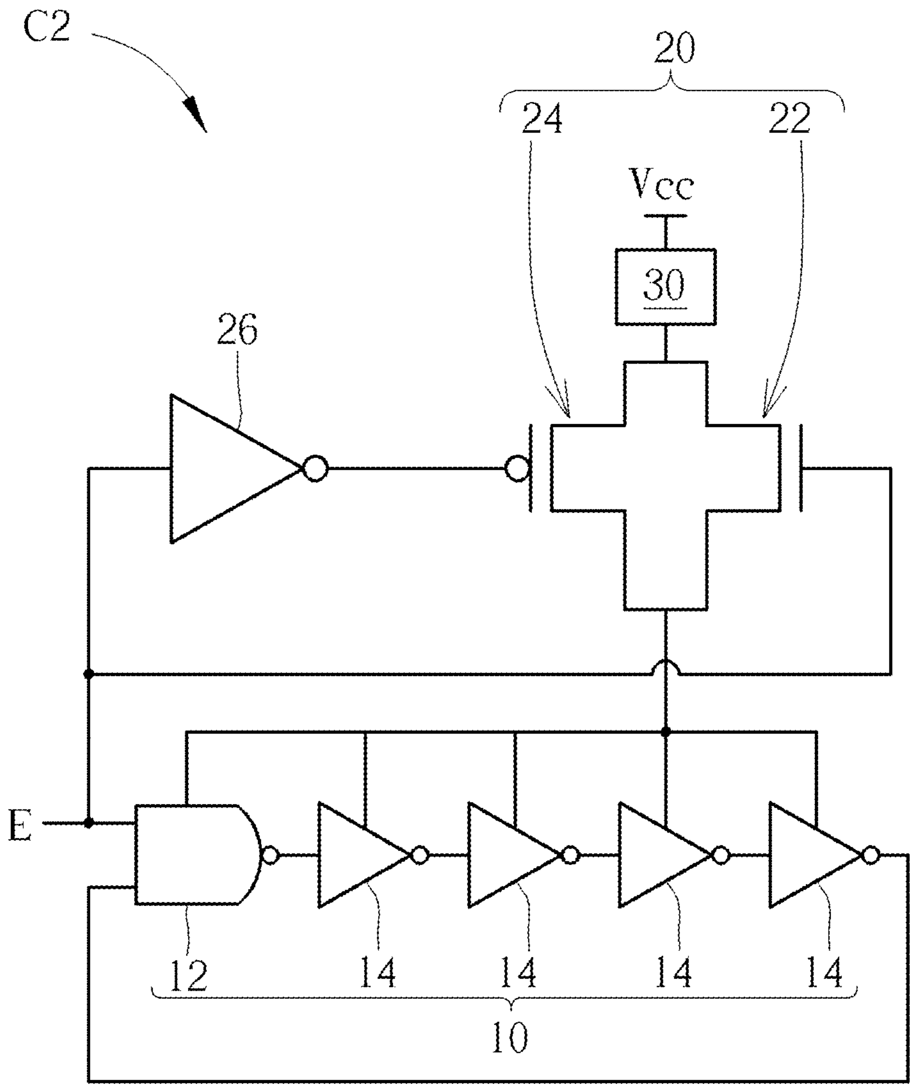
FIG. 2 is a schematic diagram of an advanced structure of a ring oscillator circuit, further illustrating the integrated design of a transmission gate and a control unit.

FIG. 2 illustrates a circuit diagram of a second embodiment of the present invention. In the second embodiment of the present invention, the transmission gate 20 of the circuit C2 is coupled to a control unit 30. The control unit 30 dynamically adjusts the conduction state of the transmission gate based on operating conditions of the ring oscillator 10 (e.g., frequency or temperature). The purpose of the control unit 30 is to dynamically adjust the conduction state of the transmission gate 20 based on the operating conditions of the ring oscillator (e.g., oscillation frequency, temperature, power supply voltage, or load variations), thereby achieving an optimal balance between leakage current reduction and oscillation performance. Conventional ring oscillator transmission gates are typically only synchronized with the enable signal E, lacking flexible adjustment capabilities. The control unit 30 generates adaptive control signals by sensing environmental or operating parameters, dynamically adjusting the on-resistance or switching timing of the transmission gate to optimize circuit performance. The control unit 30 may be a digital, analog, or hybrid circuit, with its specific structure depending on the application scenario. The control unit 30 may be a digital control unit, an analog control unit, or a hybrid control unit.

For example, assuming the ring oscillator is applied to a 5G communication module, the control unit 30 may be designed as a temperature-based analog control circuit. This circuit includes a thermistor sensor and a low-power comparator to monitor ambient temperature (ranging from −40° C. to 85° C.). When the temperature is below 0° C., the control unit outputs a high voltage (e.g., 1.2V), fully turning on the transmission gate 20 to ensure oscillation speed; when the temperature exceeds 50° C., it outputs a low voltage (e.g., 0.6V), partially turning off the transmission gate to reduce leakage current. Additionally, the control unit may integrate an 8-bit DAC, providing 256 levels of conduction states, allowing fine-tuned adjustment of the transmission gate's on-resistance (ranging from 10Ω to 10 kΩ).

The advantages of incorporating the control unit 30 include the following. First, the control unit 30 can adjust the transmission gate state based on operating conditions, such as maximizing leakage current blocking in low-frequency mode and prioritizing oscillation speed in high-frequency mode. Simulations show that this dynamic control can further reduce standby power consumption (lower than the 0.07× achieved without a control unit). Additionally, adaptability to temperature, voltage, or process variations is enhanced. For example, at high temperatures (85° C.), leakage current can be reduced by 95%, while at low temperatures (−40° C.), oscillation frequency decreases by only 2%. The control unit 30 is suitable for various scenarios, such as IoT sensors (low-frequency, low-power) or 5G base stations (high-frequency, high-performance). The control unit can be configured via software or hardware to meet different requirements. Furthermore, by finely controlling leakage current, the operating time of battery-powered devices is extended. For example, in IoT applications, standby time can be extended from 100 hours to 120 hours.

Embodiment 3

Figure 3:
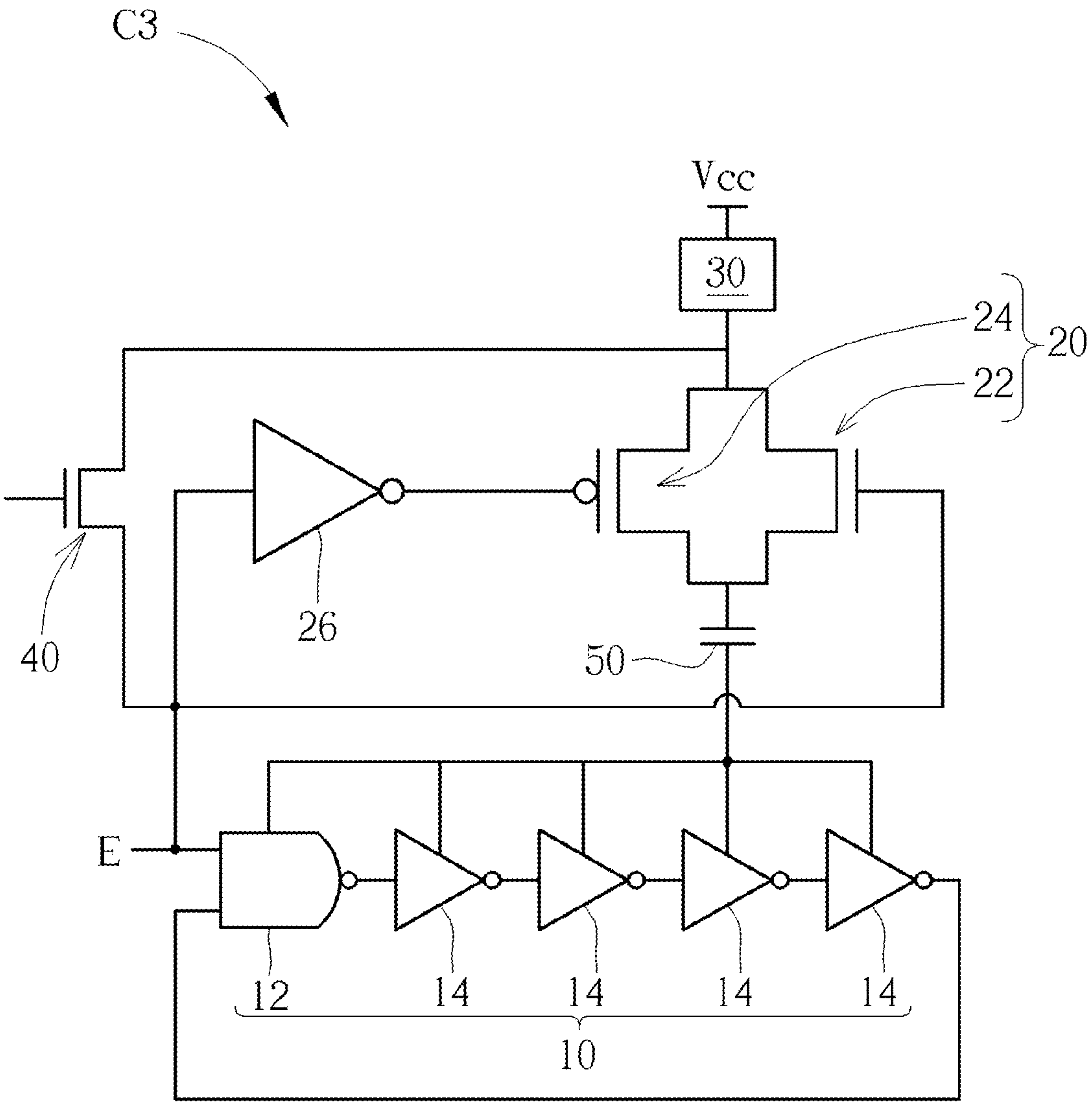
FIG. 3 is a schematic diagram of an advanced structure of a ring oscillator circuit, further illustrating the integrated design of a transmission gate, a control unit, a bypass circuit, and a stabilization unit.

FIG. 3 illustrates a circuit diagram of a third embodiment of the present invention. In the third embodiment of the present invention, the transmission gate 20 of the circuit C3 may include a bypass circuit 40, providing an alternative signal path in the active state to avoid the impact of the transmission gate on oscillation frequency. More specifically, the purpose of adding the bypass circuit 40 is to provide an alternative signal path that bypasses the transmission gate 20 when the ring oscillator 10 is in an active state, thereby reducing the impact of the transmission gate 20 on oscillation frequency. Although the transmission gate 20 effectively reduces leakage current in the stopped state, its on-resistance (Ron) and parasitic capacitance may increase signal path delay in the active state, leading to a reduction in oscillation frequency (e.g., 5%). The bypass circuit 40 ensures signal transmission with minimal delay by conducting a low-impedance path in the active state, maintaining the high-frequency performance of the ring oscillator.

As shown in FIG. 3, the bypass circuit 40 is composed of a switching element or a low-impedance path, connected in parallel with the transmission gate 20. In this embodiment, the bypass circuit 40 uses an NMOS transistor, connected in parallel with the transmission gate 20, with its control signal synchronized with the enable signal E. However, in other embodiments of the present invention, the bypass circuit 40 may include a PMOS transistor, another transmission gate, or a wire (excluding switching elements). These are all possible variations.

According to experimental results by the applicant, incorporating the bypass circuit offers the following advantages. First, the bypass circuit 40 effectively eliminates the impact of the transmission gate's on-resistance, bringing the oscillation frequency close to the ideal value (e.g., reducing frequency loss from 5% to 0.5%, but not limited thereto). Additionally, by selectively enabling the bypass circuit 40, multi-frequency operation can be supported. For example, the main path (i.e., the path through the transmission gate 20) is used in low-frequency mode, while switching to the bypass circuit 40 in high-frequency mode. The bypass circuit 40 has a simple structure (e.g., a single transistor), making it easy to integrate into existing layouts.

Furthermore, in this embodiment, in addition to the bypass circuit 40, the circuit C3 includes a stabilization unit 50 (e.g., a capacitive element) to stabilize the signal path voltage when the transmission gate is turned off, preventing a floating state. The primary function of the stabilization unit 50 is to stabilize the voltage of the signal path of the ring oscillator 10 when the transmission gate 20 is turned off, preventing instability due to floating node voltages. When the transmission gate 20 is turned off to block the signal path, certain nodes in the ring oscillator 10 may lack a defined voltage reference, potentially leading to parasitic capacitance charging, unintended leakage current, or unstable initial oscillation behavior upon circuit restart. The stabilization unit 50 ensures that the signal path voltage remains within the expected range by providing a voltage reference or charge storage mechanism, thereby improving circuit reliability and stability.

Typically, the stabilization unit 50 is composed of passive components (e.g., capacitors) or active components (e.g., voltage regulation circuits), with its specific structure depending on application requirements. In this embodiment, the stabilization unit 50 may be implemented as a 100fF MIM capacitor connected between the output node of the transmission gate 20 and ground, ensuring stable node voltage in the off state and preventing floating phenomena. Simulations show that incorporating the stabilization unit reduces node voltage fluctuations from ±200 mV to ±10 mV, shortening startup time by approximately 40%. In advanced designs, a weak pull-up PMOS transistor (W/L=1/0.03 μm) may be further added to fix the node voltage to VDD, suitable for high-reliability applications.

According to experimental results by the applicant, the advantages of incorporating the stabilization unit 50 include the following. First, it enhances circuit stability, preventing unintended leakage current or signal interference caused by floating nodes, ensuring low-power characteristics of the ring oscillator in the stopped state. Simulation results show that incorporating the stabilization unit 50 reduces node voltage fluctuations from ±200 mV to ±10 mV, improving circuit reliability. Additionally, the stabilization unit 50 improves startup behavior; specifically, during circuit restart, the stabilization unit 50 ensures that node voltages start from a known initial state, reducing oscillation startup time. For example, startup time can be reduced from 5 ns to 3 ns. Furthermore, the stabilization unit 50 has a simple structure, offering strong compatibility with existing components and easy integration into existing processes (e.g., 14 nm FinFET) without significant modifications to the core design of the ring oscillator. Finally, the stabilization unit 50 can absorb power supply or substrate noise, reducing its impact on the signal path, with significant effects in high-frequency operations (e.g., above 10 GHz), lowering noise sensitivity.

It is worth noting that, in the embodiment shown in FIG. 3, the circuit C3 incorporates the control unit 30 from the second embodiment, as well as the newly added bypass circuit 40 and stabilization unit 50. Incorporating all these components can achieve the aforementioned advantages. However, in actual manufacturing processes, adding components increases process cost and complexity. Therefore, in other embodiments of the present invention, the circuit C1 shown in FIG. 1 may be used as a base, with the control unit 30, bypass circuit 40, or stabilization unit 50 added individually, or any two of the three added. All such combinations fall within the scope of the present invention.

Summarizing the first to third embodiments, the present invention offers the following features compared to conventional ring oscillators. Conventional ring oscillators may still generate leakage current in the standby state, increasing the power consumption of the components. The present invention solves this issue by introducing the transmission gate 20 (e.g., as shown in the embodiment of FIG. 1). The transmission gate 20 is a switching element composed of an N-type transistor 22 and a P-type transistor 24 connected in parallel, with its conduction state determined by a control signal. When the ring oscillator 10 stops operating, the enable signal E simultaneously turns off the transmission gate 20, cutting off the power supply to the NAND gate 12 and the inverters 14, effectively blocking the signal path and preventing leakage current from passing through, thereby significantly reducing standby power consumption.

Several advanced embodiments of the present invention (e.g., FIG. 2 or 3) further enhance the circuit's flexibility. In these designs, the transmission gate 20 is coupled to a control unit 30, which dynamically adjusts the conduction state of the transmission gate based on the operating conditions of the ring oscillator (e.g., frequency, temperature, or power supply voltage). For example, in low-frequency operation, the control unit can fully turn off the transmission gate to maximize leakage current blocking; in high-frequency operation, the transmission gate can be partially turned on to maintain oscillation signal stability. This dynamic control mechanism not only enhances the circuit's adaptability but also enables it to meet diverse application requirements. Additionally, to avoid potential impacts of the transmission gate 20 on oscillation frequency in the active state, a bypass circuit 40 may be added. The bypass circuit 40, connected in parallel with the transmission gate 20, provides an alternative signal path in the active state, ensuring oscillation performance is not compromised. Simultaneously, a stabilization unit 50 (e.g., a capacitive element) may be coupled to the output of the transmission gate 20 to stabilize the signal path voltage when turned off, preventing floating states.

In summary, the present invention provides a ring oscillator circuit C1 characterized by comprising a ring oscillator 10, which includes a plurality of series-connected logic elements (including a NAND gate 12 and a plurality of inverters 14) for generating an oscillation signal, and a transmission gate 20 coupled to the signal path of the ring oscillator 10. When the ring oscillator 10 is in a stopped state, the transmission gate 20 is turned off to block the signal path, thereby reducing the leakage current of the ring oscillator 10.

In some embodiments of the present invention, the ring oscillator 10 comprises at least one NAND gate 12 and a plurality of inverters 14, with the transmission gate 20 coupled between the NAND gate 12 and the inverters 14.

In some embodiments of the present invention, the transmission gate 20 comprises an N-type transistor 22 and a P-type transistor 24 configured in parallel, with the control signal of the transmission gate 20 synchronized with the enable signal E of the ring oscillator 10.

In some embodiments of the present invention, the size design of the transmission gate 20 has a width-to-length ratio (W/L) of 3*2/0.03 micrometers or 20/0.016 micrometers to optimize the balance between leakage current reduction and circuit speed.

In some embodiments of the present invention, the standby current (Istandby) of the ring oscillator 10 in steady-state is reduced to 0.07 times or less compared to a conventional ring oscillator without a transmission gate (as mentioned earlier, in a 22 nm process, the standby current is reduced from 1.00× to 0.07×, a significant reduction of 93%; in a 14 nm process, the standby current is reduced from 1.00× to 0.04×, a significant reduction of 96%).

In some embodiments of the present invention, the transmission gate 20 employs high-threshold voltage (HVt) or standard-threshold voltage (SVt) transistors to further reduce subthreshold leakage current.

In some embodiments of the present invention, the operating frequency of the ring oscillator 10, after incorporating the transmission gate 20, experiences a speed reduction controlled within 5.1% to 5.9% compared to a configuration without a transmission gate.

In some embodiments of the present invention, the transmission gate 20 is further coupled to a control unit 30, which dynamically adjusts the conduction state of the transmission gate 20 based on the operating conditions of the ring oscillator 10 to optimize the balance between leakage current reduction and oscillation performance.

In some embodiments of the present invention, the transmission gate 20 can be selectively partially turned on in the active state of the ring oscillator 10 to adjust the oscillation frequency of the ring oscillator 10.

In some embodiments of the present invention, the transmission gate 20 is coupled to a stabilization unit 50, which comprises a capacitive element or an active voltage regulation circuit, used to stabilize the signal path voltage of the ring oscillator 10 when the transmission gate 20 is turned off.

In some embodiments of the present invention, the configuration of the transmission gate further comprises a bypass circuit 40 to provide an alternative signal path when the ring oscillator 10 is in an active state, maintaining oscillation performance.

In some embodiments of the present invention, the ring oscillator circuit C1 is applied to low-power electronic devices to enhance the overall energy efficiency of the circuit.

The efficacy of the ring oscillator circuit of the present invention is evident. Simulation results show that its standby current can be reduced to 0.07 times or less of that of conventional circuits, significantly improving energy efficiency. This characteristic makes it particularly suitable for low-power electronic devices, such as mobile devices, wearable devices, and IoT nodes. By reducing standby power consumption, the present invention not only extends battery life but also provides new possibilities for circuit design in advanced processes. In the future, with further optimization of the control unit or bypass circuit, the present invention can play a role in a broader range of fields.

In conclusion, the feature of the present invention lies in that the ring oscillator circuit provided by the invention comprises a ring oscillator and a transmission gate. The ring oscillator is composed of a plurality of series-connected logic elements, such as a NAND gate and inverters, functioning to generate a stable oscillation signal. The transmission gate serves as a controllable switch, configured at a critical position in the signal path. When the enable signal is low (i.e., stopped state), the transmission gate is turned off, interrupting the signal flow between logic elements, thereby suppressing the generation of subthreshold leakage current. Compared to conventional technologies, the advantage of the present invention lies in its ability to significantly reduce standby power consumption while offering possibilities for further optimization, such as dynamic control or bypass design, making it suitable for various low-power scenarios.

The above descriptions are merely preferred embodiments of the present invention. All equivalent changes and modifications made in accordance with the patent claims of the present invention shall fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A ring oscillator circuit, characterized by comprising:

a ring oscillator comprising at least one NAND gate and a plurality of inverters connected in series for generating an oscillation signal; and a transmission gate coupled between the NAND gate and the plurality of inverters, the transmission gate having a first end coupled to a voltage source and a second end coupled to the NAND gate and the plurality of inverters to selectively provide a startup voltage thereto, wherein when the ring oscillator is in a stopped state, the transmission gate is turned off to block the signal path, thereby reducing the leakage current of the ring oscillator.

2. The ring oscillator circuit of claim 1, wherein the transmission gate comprises a P-type transistor and an N-type transistor configured in parallel, with the control signal of the transmission gate synchronized with the enable signal of the ring oscillator.

3. The ring oscillator circuit of claim 1, wherein the size design of the transmission gate has a width-to-length ratio (W/L) of 3*2/0.03 micrometers or 20/0.016 micrometers to optimize the balance between leakage current reduction and circuit speed.

4. The ring oscillator circuit of claim 1, wherein the standby current of the ring oscillator in steady-state is reduced to 0.07 times or less compared to a conventional ring oscillator without a transmission gate.

5. The ring oscillator circuit of claim 1, wherein the transmission gate employs high-threshold voltage (HVt) transistors or standard-threshold voltage (SVt) transistors to further reduce subthreshold leakage current.

6. The ring oscillator circuit of claim 1, wherein the operating frequency of the ring oscillator, after incorporating the transmission gate, experiences a speed reduction controlled within 5.1% to 5.9% compared to a configuration without a transmission gate.

7. The ring oscillator circuit of claim 1, wherein the transmission gate is further coupled to a control unit, which dynamically adjusts the conduction state of the transmission gate based on the operating conditions of the ring oscillator to optimize the balance between leakage current reduction and oscillation performance.

8. The ring oscillator circuit of claim 1, wherein the transmission gate can be selectively partially turned on in the active state of the ring oscillator to adjust the oscillation frequency of the ring oscillator.

9. The ring oscillator circuit of claim 1, wherein the transmission gate is coupled to a stabilization unit, which comprises a capacitive element or an active voltage regulation circuit, used to stabilize the signal path voltage of the ring oscillator when the transmission gate is turned off.

10. The ring oscillator circuit of claim 1, wherein the configuration of the transmission gate further comprises a bypass circuit to provide an alternative signal path when the ring oscillator is in an active state, maintaining oscillation performance.

11. The ring oscillator circuit of claim 1, wherein the ring oscillator circuit is applied to low-power electronic devices to enhance the overall energy efficiency of the circuit.

* * * * *